United States Patent
Kim et al.

(10) Patent No.: US 9,246,123 B2
(45) Date of Patent: Jan. 26, 2016

(54) ORGANIC LIGHT-EMITTING DISPLAY DEVICE AND METHOD OF MANUFACTURING THE SAME

(71) Applicant: Samsung Display Co., Ltd., Yongin, Gyeonggi-do (KR)

(72) Inventors: Kyung Ho Kim, Seoul (KR); Jin Koo Chung, Suwon-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/107,724

(22) Filed: Dec. 16, 2013

(65) Prior Publication Data

US 2014/0183483 A1      Jul. 3, 2014

(30) Foreign Application Priority Data

Jan. 3, 2013    (KR) .................... 10-2013-0000641

(51) Int. Cl.
*H01L 51/52*    (2006.01)
(52) U.S. Cl.
CPC .................. *H01L 51/5228* (2013.01)
(58) Field of Classification Search
CPC .................................................. H01L 51/5228
USPC ............... 257/40, 59, 72, 83; 438/91, 149
See application file for complete search history.

(56) References Cited

U.S. PATENT DOCUMENTS

| 7,173,373 | B2 | 2/2007 | Yamada et al. | |
|---|---|---|---|---|
| 2008/0116463 | A1* | 5/2008 | Ito | H01L 51/5203 257/72 |
| 2008/0218068 | A1* | 9/2008 | Cok | 313/505 |
| 2010/0308335 | A1* | 12/2010 | Kim et al. | 257/59 |
| 2011/0186820 | A1* | 8/2011 | Kim | C23C 14/044 257/40 |
| 2011/0229994 | A1* | 9/2011 | Jung | 438/29 |
| 2012/0220061 | A1* | 8/2012 | Kwon | H01L 27/3246 438/29 |
| 2012/0313099 | A1* | 12/2012 | Chung | H01L 27/3276 257/59 |

FOREIGN PATENT DOCUMENTS

| KR | 1020050098596 A | 10/2005 |
|---|---|---|
| KR | 1020090132359 A | 12/2009 |
| KR | 1020120066492 A | 6/2012 |

* cited by examiner

*Primary Examiner* — Marc Armand
*Assistant Examiner* — Wasiul Haider
(74) *Attorney, Agent, or Firm* — Robert E. Bushnell, Esq.

(57) ABSTRACT

Provided is an organic light-emitting display device comprising a substrate, an insulating layer disposed on the substrate, a first electrode disposed on the insulating layer, an organic layer disposed on the first electrode, a second electrode disposed on the organic layer, an auxiliary electrode disposed on the insulating layer and a metal layer disposed adjacent to the auxiliary electrode and connected to the auxiliary electrode and the second electrode.

20 Claims, 6 Drawing Sheets

ORGANIC LIGHT-EMITTING DISPLAY DEVICE AND METHOD OF MANUFACTURING THE SAME

This application claims priority from Korean Patent Application No. 10-2013-0000641 filed on Jan. 3, 2013 in the Korean Intellectual Property Office, the disclosure of which is incorporated herein by reference in its entirety.

BACKGROUND OF THE INVENTION

1. Field of the Invention

The present invention relates to an organic light-emitting display device and a method of manufacturing the same, and more particularly, to an organic light-emitting display device which includes an auxiliary electrode connected to a cathode electrode and a method of manufacturing the organic light-emitting display device.

2. Description of the Related Art

An organic light-emitting display device may include a plurality of pixels, and each of the pixels may include a first electrode, a second electrode, and an organic layer interposed between the first electrode and the second electrode. The organic layer may emit light at a luminance level corresponding to an electric current flowing between the first electrode and the second electrode. The organic light-emitting display device may display a desired image by controlling the electric current flowing between the first electrode and the second electrode.

The first electrode may be a separate electrode provided in each pixel, and a signal corresponding to a gray level displayed by each pixel may be transmitted to the first electrode. The second electrode may be placed over a plurality of pixels, or each of the plurality of pixels may comprise a separated second electrode to which a signal common to the second electrodes is transmitted. The first electrode, the second electrode, and the organic layer may function as a diode. The first electrode may function as an anode, and the second electrode may function as a cathode.

If the organic light-emitting display device is a top emission organic light-emitting display device which displays an image by emitting light through the second electrode, the second electrode may be formed of a transparent conductive material. For example, the second electrode may be formed of indium tin oxide (ITO), indium zinc oxide (IZO), a compound of magnesium (Mg) and silver (Ag), a compound of calcium (Ca) and Ag, or a compound of lithium (Li) and aluminum (Al). The transparent conductive material that forms the second electrode generally has higher resistivity than a single metal. Therefore, a voltage drop may occur at a location far away from a portion of the second electrode to which a voltage is applied. As a result, display quality of the organic light-emitting display device may be degraded. To prevent such a voltage drop of the second electrode, the organic light-emitting display device may further include an auxiliary electrode which is connected to the second electrode and is formed of a metal having low resistivity.

Since a top-emission organic light-emitting display device emits light through the second electrode, light transmittance of the second electrode needs to be enhanced. To this end, the second electrode may be formed thin. However, the thin second electrode may not be connected to the auxiliary electrode.

SUMMARY OF THE INVENTION

Aspects of the present invention provide an organic light-emitting display device with improved connection of a second electrode to an auxiliary electrode and a method of manufacturing the organic light-emitting display device.

Aspects of the present invention also provide an organic light-emitting display device in which the connection of a second electrode to an auxiliary electrode is improved to enhance display quality and a method of manufacturing the organic light-emitting display device.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an organic light-emitting display device comprising a substrate, an insulating layer disposed on the substrate, a first electrode disposed on the insulating layer, an organic layer disposed on the first electrode, a second electrode disposed on the organic layer, an auxiliary electrode disposed on the insulating layer and a metal layer disposed adjacent to the auxiliary electrode and connected to the auxiliary electrode and the second electrode.

According to another aspect of the present invention, there is provided a method of manufacturing an organic light-emitting display device, the method comprising forming an insulating layer on a substrate, forming a first electrode and an auxiliary electrode on the insulating layer, forming an organic layer on the first electrode and forming a second electrode on the organic layer, and forming a metal layer, which is connected to the second electrode and the auxiliary electrode, on the second electrode and the auxiliary electrode. The auxiliary electrode is separated from the first electrode.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
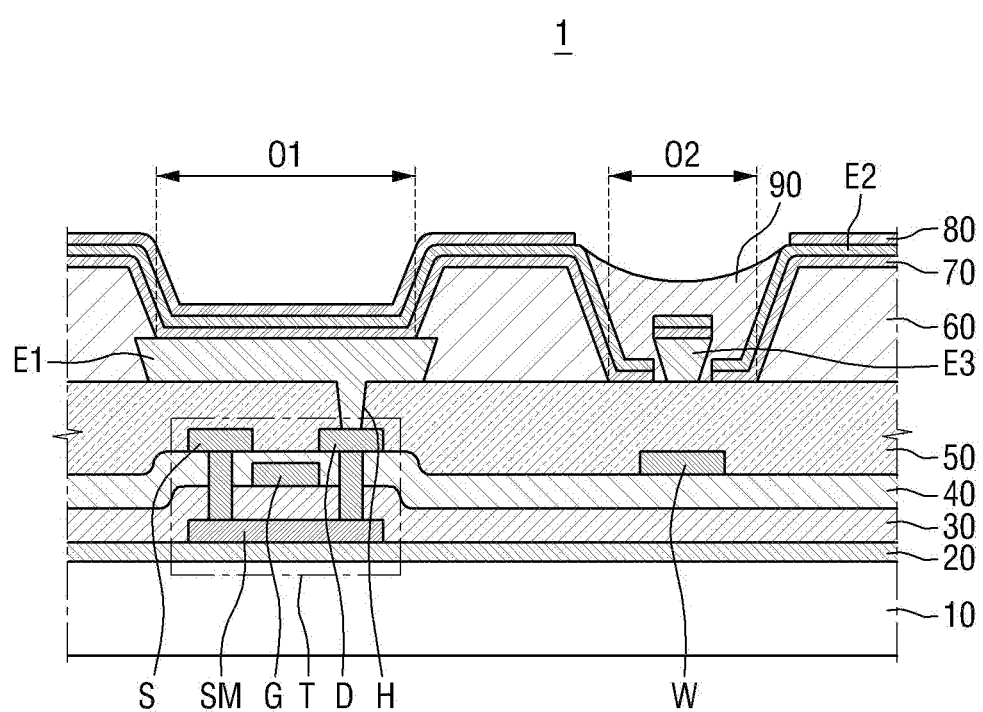
FIG. 1 is a cross-sectional view of an organic light-emitting display device according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Embodiments of the present invention will hereinafter be described with reference to the attached drawings.

FIG. 1 is a cross-sectional view of an organic light-emitting display device 1 according to an embodiment of the present invention.

Referring to FIG. 1, the organic light-emitting display device 1 includes a substrate 10, a planarization layer 50, a first electrode E1, an organic layer 70, a second electrode E2, an auxiliary electrode E3, and a metal layer 90.

The substrate 10 may support other components of the organic light-emitting display device 1. The substrate 10 may be formed of an insulating material. For example, the substrate 10 may be formed of, but not limited to, glass, polyethylene terephthalate (PET), polycarbonate (PC), polyethersulfone (PES), polyimide (PI), or polymethyl methacrylate (PMMA). According to some embodiments, the substrate 10 may also be formed of a flexible material.

The planarization layer 50 may be disposed on the substrate 10. To improve the emission efficiency of the organic layer 70 disposed on the planarization layer 50, the planarization layer 50 may be formed to have a flat top surface without a step difference. The planarization layer 50 may be formed of an insulating material. For example, the planarization layer 50 may be formed of one or more materials selected from, but not limited to, polyacrylates resin, epoxy resin, phenolic resin, polyamides resin, polyimides rein, unsaturated polyesters resin, poly phenylenethers resin, poly phenylenesulfides resin, and benzocyclobutene (BCB).

A contact hole H may be formed in the planarization layer 50. The contact hole H may be formed to expose a top surface of a drain electrode D of a thin-film transistor T which will be described later. The first electrode E1 and the drain electrode D may be connected to each other by the contact hole H.

The first electrode E1 may be disposed on the planarization layer 50. The first electrode E1 may be connected to the drain electrode D by the contact hole H. A signal transmitted from the drain electrode D to the first electrode E1 may control light emission of the organic layer 70.

The first electrode E1 may be formed of a reflective conductive material. For example, the first electrode E1 may be formed to have a structure of, but not limited to, Ag/indium tin oxide (ITO), ITO/Ag/ITO, Mo/ITO, Al/ITO, or Ti/ITO. The first electrode E1 formed of a reflective conductive material may reflect light generated by the organic layer 70 in an upward direction.

The auxiliary electrode E3 may be formed on the planarization layer 50 to be separated from the first electrode E1. The auxiliary electrode E3 may be formed on the same layer as the first electrode E1. The auxiliary electrode E3 and the first electrode E1 may be formed by the same process. The auxiliary electrode E3 may be formed of the same material as the first electrode E1. However, the present invention is not limited thereto.

The cross-section of the auxiliary electrode E3 may be shaped like an inverted trapezoid whose upper side is longer than a lower side. If the auxiliary electrode E3 is shaped like an inverted trapezoid, the organic layer 70 may be deposited such that it is interrupted in a region adjacent to the auxiliary electrode E3. The auxiliary electrode E3 disposed under the organic layer 70 and the second electrode E2 disposed on the organic layer 70 may be electrically connected to each other by the region in which the organic layer 70 is interrupted. The auxiliary electrode E3 may be formed of a material with lower resistivity than the material that forms the second electrode E2 and may be electrically connected to the second electrode E2. Therefore, the auxiliary electrode E3 may reduce a drop in a voltage applied to the second electrode E2.

If the auxiliary electrode E3 is shaped like an inverted trapezoid, the second electrode E2 may be deposited such that it is interrupted in the region adjacent to the auxiliary electrode E3. Therefore, the second electrode E2 and the auxiliary electrode E3 may not contact each other. The organic light-emitting display device 1 includes the metal layer 90 disposed in the region adjacent to the auxiliary electrode E3 in order to improve electrical connection of the second electrode E2 and the auxiliary electrode E3.

The organic layer 70 may be disposed on the first electrode E1. The organic layer 70 may be disposed on the whole surface of the organic light-emitting display device 1. An electric current flowing through the organic layer 70 may be controlled by a signal transmitted to the first electrode E1 and the second electrode E2. The organic layer 70 may emit light at a luminance level corresponding to the electric current flowing through the organic layer 70. The organic layer 70 may emit light of one of red, blue and green colors. According to some embodiments, the organic layer 70 may emit white light. The color of light emitted from the organic layer 70 is not limited to the above colors and may vary depending on embodiments.

The second electrode E2 may be disposed on the organic layer 70. The second electrode E2 may be placed over a plurality of pixels. The second electrode E2 may be placed on the whole surface of the organic light-emitting display device 1. The second electrode E2 may be formed of an optically transparent or semi-transparent conductive material. For example, the second electrode E2 may be formed of, but not limited to, indium tin oxide (ITO), indium zinc oxide (IZO), a compound of magnesium (Mg) and silver (Ag), a compound of calcium (Ca) and Ag, or a compound of lithium (Li) and aluminum (Al). Light generated by the organic layer 70 may be emitted to the outside of the organic light-emitting display device 1 through the second electrode E2. To improve light transmittance of the second electrode E2, the second electrode E2 may be formed thin. For example, the second electrode E2 may be formed to a thickness of 200 Å or less.

The material that forms the second electrode E2 may have relatively higher resistivity than typical metals. In addition, since the second electrode E2 can be formed thin, a voltage applied to the second electrode E2 may drop due to the resistivity of the second electrode E2. Accordingly, the second electrode E2 may have a different voltage value in each pixel. However, the organic light-emitting display device 1 can reduce the voltage drop of the second electrode E2 by including the auxiliary electrode E3 which is electrically connected to the second electrode E2 and has lower resistivity than the second electrode E2.

The metal layer 90 may be placed adjacent to the auxiliary electrode E3. The metal layer 90 may electrically connect the second electrode E2 and the auxiliary electrode E3 by making the second electrode E2 contact the auxiliary electrode E3 through the metal layer 90. The auxiliary electrode E3 shaped like an inverted trapezoid and the second electrode E2 formed thin may not easily contact each other. However, the metal layer 90 placed adjacent to the auxiliary electrode E3 improves electrical connection of the auxiliary electrode E3 and the second electrode E2, thereby reducing a voltage drop due to the resistivity of the second electrode E2. Accordingly, display quality of the organic light-emitting display device 1 can be improved. The metal layer 90 may be formed of a single metal or a compound of two or more types of metals. For example, the metal layer 90 may be formed of one or more materials selected from, but not limited to, Mg, Al, Ag, and Cu. The metal layer 90 can be deposited in the region adjacent to the auxiliary electrode E3 without using a mask. This will be described in more detail later.

The organic light-emitting display device 1 may further include a buffer layer 20, a semiconductor layer SM, a gate electrode G, a source electrode S, a drain electrode D, a gate insulating layer 30, an interlayer insulating film 40, a wiring line W, a pixel defining layer 60, and a capping layer 80.

The buffer layer 20 may be formed on a top surface of the substrate 10. The buffer layer 20 may prevent penetration of impurity elements and planarize the top surface of the substrate 10. The buffer layer 20 may be formed of various materials that can perform the above functions. For example, the buffer layer 20 may be formed of any one of a silicon nitride ($SiN_x$) layer, a silicon oxide ($SiO_2$) layer, and a silicon oxynitride ($SiO_xN_y$) layer. According to some embodiments, the buffer layer 20 may also be omitted.

The semiconductor layer SM may be disposed on the buffer layer 20. The semiconductor layer SM may be formed of an amorphous silicon layer or a polycrystalline silicon layer. The semiconductor layer SM may include a channel region undoped with impurities and a source region and a drain region which are disposed on both sides of the channel region and are p+-doped to contact the source electrode S and the drain electrode D, respectively. Impurities used to dope the semiconductor layer SM may be P-type impurities including boron (B), such as $B_2H_6$. The type of impurities used to dope the semiconductor layer SM may vary depending on the embodiment. According to some embodiments, the semiconductor layer SM may also be replaced by an oxide semiconductor layer.

The gate insulating layer 30 may be disposed on the semiconductor layer SM. The gate insulating layer 30 may insulate the gate electrode G, which will be formed later, and the semiconductor layer SM from each other. The gate insulating layer 30 may be formed of silicon nitride ($SiN_x$) or silicon oxide ($SiO_2$).

The gate electrode G may be disposed on the gate insulating layer 30. The gate electrode G may overlap at least a region of the semiconductor layer SM. A voltage applied to the gate electrode G may control the semiconductor layer SM to have conductivity or non-conductivity. For example, if a relatively high voltage is applied to the gate electrode G, the semiconductor layer SM may have conductivity, thereby electrically connecting the drain electrode D and the source electrode S to each other. If a relatively low voltage is applied to the gate electrode, the semiconductor layer SM may have non-conductivity, thereby insulating the drain electrode D and the source electrode S from each other.

The interlayer insulating film 40 may be disposed on the gate electrode G. The interlayer insulating film 40 may cover the gate electrode G and insulate the gate electrode G from the source electrode S and the drain electrode D. The interlayer insulating film 40 may be formed of $SiN_x$ or $SiO_2$.

The source electrode S and the drain electrode D may be disposed on the interlayer insulating film 40. The source electrode S and the drain electrode D may respectively be connected to the semiconductor layer SM by through holes which penetrate through the interlayer insulating film 40 and the gate insulating layer 30. The source electrode S, the drain electrode D, the gate electrode G, and the semiconductor layer SM may form the thin-film transistor T, and the thin-film transistor T may determine whether to provide a signal transmitted to the source electrode S to the drain electrode D based on the voltage applied to the gate electrode G.

The wiring line W may be a data line connected to the source electrode S or a gate line connected to the gate electrode G. If the wiring line W is a data line, it may be formed on the same layer as the source electrode S. In FIG. 1, the wiring line W is formed on the same layer as the source electrode S. However, if the wiring line W is a gate line, it may be formed on the same layer as the gate electrode G. The type of the wiring line W and a layer on which the wiring line W is disposed are not limited to the above example and can vary depending on embodiments. The wiring line W may be placed under the auxiliary electrode E3 to be overlapped by the auxiliary electrode E3. However, the present invention is not limited thereto.

The pixel defining layer 60 may be disposed on the planarization layer 50. The pixel defining layer 60 may define regions of the pixels included in the organic light-emitting display device 1. The pixel defining layer 60 may not completely cover a top surface of the planarization layer 50. The organic light-emitting display device 1 may include a first aperture O1 which exposes the first electrode E1 and in which the pixel defining layer 60 is not disposed and a second aperture O2 which exposes the auxiliary electrode E3 and in which the pixel defining layer 60 is not disposed. The first aperture O1 may be defined as a pixel. The auxiliary electrode E3 and the metal layer 90 may be disposed in the second aperture O2.

Figure 2:
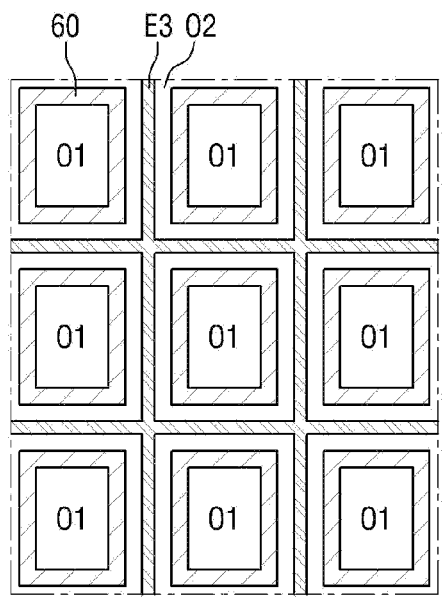
FIG. 2 is a plan view illustrating the arrangement of pixel defining layers, first apertures, second apertures, and auxiliary electrodes according to an embodiment of the present invention.

The arrangement of the pixel defining layer 60, the first aperture O1, the second aperture O2, and the auxiliary electrode E3 will now be described in more detail with reference to FIG. 2. FIG. 2 is a plan view illustrating the arrangement of pixel defining layers 60, first apertures O1, second apertures O2, and auxiliary electrodes E3 according to an embodiment of the present invention.

Referring to FIG. 2, the pixel defining layers 60 may be placed around the first apertures O1, respectively. The first apertures O1 may be arranged in a matrix pattern. In FIG. 2, the first apertures O1 and the pixel defining layer 60 are rectangular. However, the shape of the first apertures O1 and the pixel defining layer 60 is not limited to the rectangular shape and can vary depending on embodiments. The second apertures O2 may be arranged in a lattice pattern. The auxiliary electrodes E3 placed within the second apertures O2 may also be arranged in a lattice pattern according to the arrangement pattern of the second apertures O2.

Figure 3:
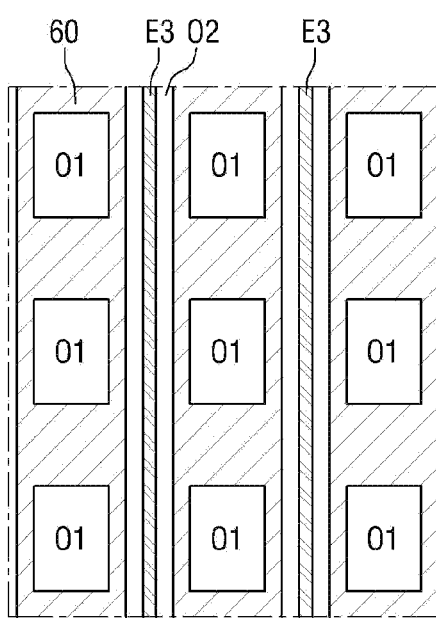
FIG. 3 is a plan view illustrating the arrangement of pixel defining layers, first apertures, second apertures, and auxiliary electrodes according to another embodiment of the present invention.

FIG. 3 is a plan view illustrating the arrangement of pixel defining layers 60, first apertures O1, second apertures O2, and auxiliary electrodes E3 according to another embodiment of the present invention. Referring to FIG. 3, the second apertures O2 may be arranged in a stripe pattern. The auxiliary electrodes E3 placed within the second apertures O2 may also be arranged in a stripe pattern according to the arrangement pattern of the second apertures O2.

Referring back to FIG. 1, the capping layer 80 may be disposed on the second electrode E2. The capping layer 80 may be disposed on the first electrode E1 or in the first aperture O1. The capping layer 80 may control optical characteristics of light emitted from the organic layer 70. The capping layer 80 may not be disposed in the region adjacent to the auxiliary electrode E3. For example, the capping layer 80 may not be disposed in the second aperture O2. The capping layer 80 may be formed of an organic material. If the capping layer 80 is formed of an organic material, its adhesion to a metal may be low. Therefore, after the capping layer 80 is formed, the metal layer 90 can be formed without a mask. That is, due to the low adhesion of the capping layer 80 to a metal, the metal that forms the metal layer 90 may be deposited not on the capping layer 80 but only on the second aperture O2 in which the capping layer 80 is not formed. Therefore, since the organic light-emitting display device 1 includes the capping layer 80 not disposed in the second aperture O2, the metal layer 90 can be formed without using a mask, thereby simplifying the process of manufacturing the organic light-emitting display device 1.

A method of manufacturing the organic light-emitting display device 1 will now be described with reference to FIGS. 4 through 9. FIGS. 4 through 9 are cross-sectional views of an organic light-emitting display device, illustrating a method of manufacturing an organic light-emitting display device according to an embodiment of the present invention.

Figure 4:
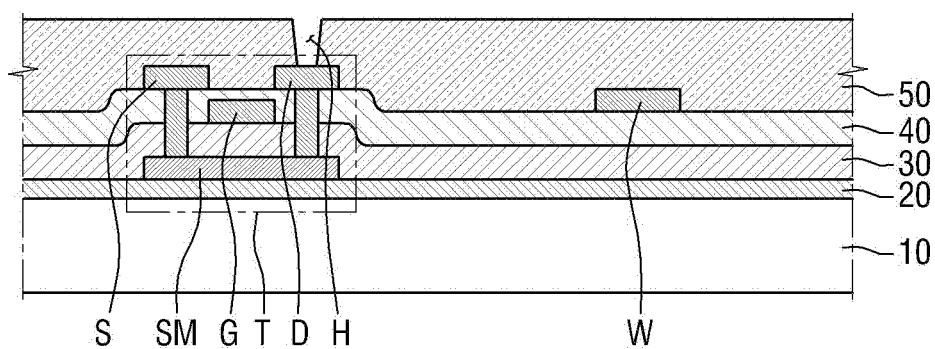
FIGS. 4 through 9 are cross-sectional views of an organic light-emitting display device, illustrating a method of manufacturing an organic light-emitting display device according to an embodiment of the present invention.

Referring to FIG. 4, the method of manufacturing the organic light-emitting display device 1 may include forming a thin-film transistor T on a substrate 10. Before the formation of the thin-film transistor T, a buffer layer 20 may be formed on the substrate 10, and a semiconductor layer SM may be formed on the substrate 10. After the formation of the semiconductor layer SM, a gate insulating layer 30 may be formed to cover the semiconductor layer SM. After the formation of the gate insulating layer 30, a gate electrode G may be formed. After the formation of the gate electrode G, an interlayer insulating film 40 may be formed to cover the gate electrode G. After the formation of the interlayer insulating film 40, two contact holes may be formed to penetrate through the interlayer insulating film 40 and the gate insulating layer 30. A source electrode S and a drain electrode D may be formed on the two contact holes such that the source electrode S and the drain electrode D are electrically connected to the semiconductor layer SM by the contact holes. The semiconductor layer SM, the gate insulating layer 30, the gate electrode G, the interlayer insulating film 40, the source electrode S and the drain electrode D formed as described above may form the thin-film transistor T on the substrate 10. Herein, any insulating layer such as the gate insulating layer 30 or the interlayer insulating layer 40 can be referred to as an insulating layer.

The method of manufacturing the organic light-emitting display device 1 may include forming a wiring line W. If the wiring line W is a data line, it may be formed by the same process as the source electrode S and the drain electrode D. If the wiring line W is a gate line, it may be formed by the same process as the gate electrode G and may be formed on the same layer as the gate electrode G.

The method of manufacturing the organic light-emitting display device 1 may further include forming a planarization layer 50. The planarization layer 50 may be formed on the thin-film transistor T. A contact hole H may be formed in the planarization layer 50 to expose the drain electrode D.

Figure 5:
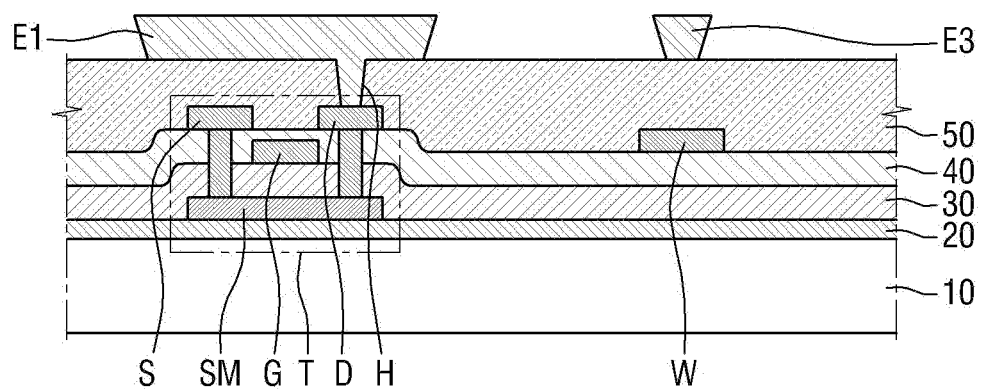

Referring to FIG. 5, the method of manufacturing the organic light-emitting display device 1 may include forming a first electrode E1 and an auxiliary electrode E3. The first electrode E1 and the auxiliary electrode E3 may be formed by the same process. The first electrode E1 and the auxiliary electrode E3 may be formed on the planarization layer 50. The first electrode E1 may be formed on the contact hole H to be electrically connected to the drain electrode D. The auxiliary electrode E3 may be shaped like an inverted trapezoid. If the auxiliary electrode E3 is shaped like an inverted trapezoid, the pattern of the organic layer 70 may be interrupted in the vicinity of the auxiliary electrode E3, thus creating a path by which the auxiliary electrode E3 and a second electrode E2 can be connected to each other.

Figure 6:
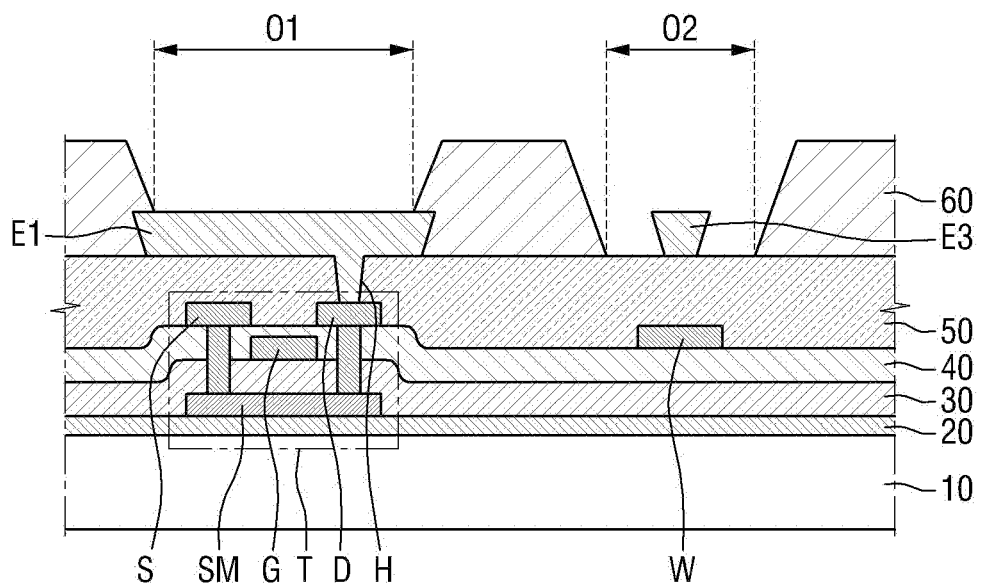

Referring to FIG. 6, the method of manufacturing the organic light-emitting display device 1 may include forming a pixel defining layer 60. The pixel defining layer 60 may be disposed on the planarization layer 50. The pixel defining layer 60 may be formed to include a first aperture O1 which exposes the first electrode E1 and a second aperture O2 which is separated from the first aperture O1 and exposes the auxiliary electrode E3.

Figure 7:
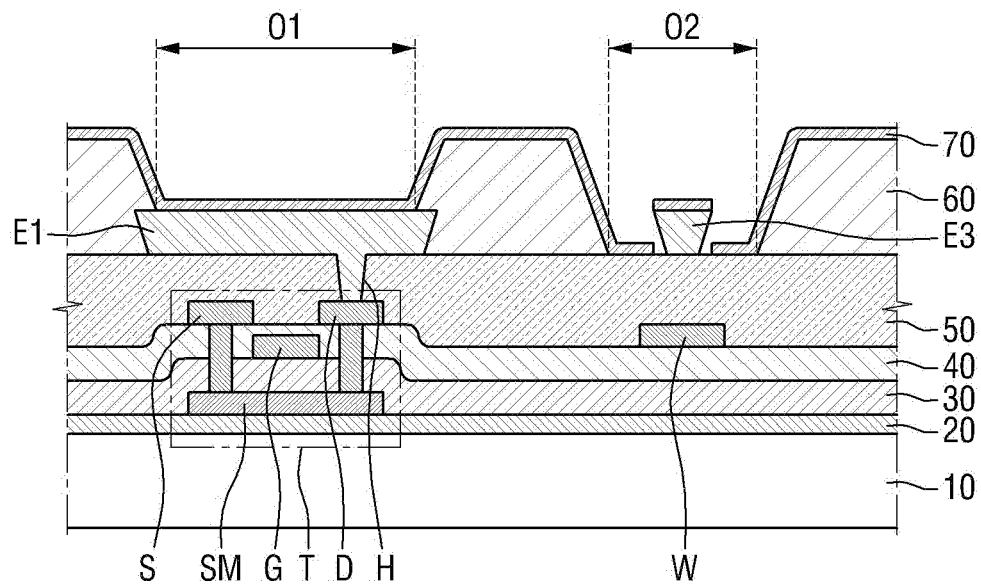

Referring to FIG. 7, the method of manufacturing the organic light-emitting display device 1 may include forming an organic layer 70. The organic layer 70 may be formed on the first electrode E1, the pixel defining layer 60, the planarization layer 50, and the auxiliary electrode E3. The organic layer 70 may be formed on the whole surface of the organic light-emitting display device 1. The pattern of the organic layer 70 may be interrupted in a region adjacent to the auxiliary electrode E3.

Figure 8:
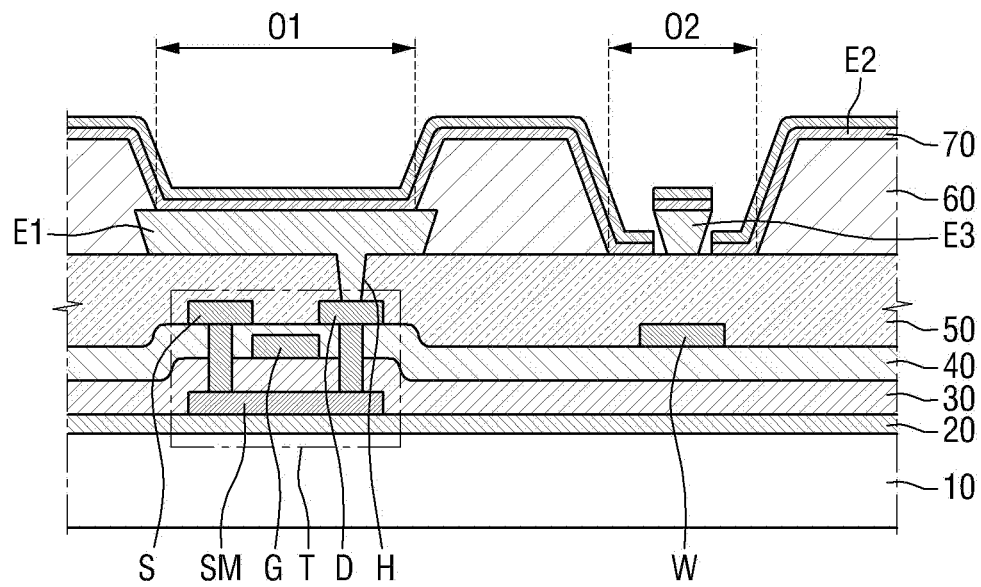

Referring to FIG. 8, the method of manufacturing the organic light-emitting display device 1 may include forming the second electrode E2. The second electrode E2 may be formed on the organic layer 70. The second electrode E2 may be formed on the whole surface of the organic light-emitting display device 1. To improve transmittance of light generated by the organic layer 70, the second electrode E2 may be formed thin. For example, the second electrode E2 may be formed to a thickness of 200 Å or less.

Figure 9:
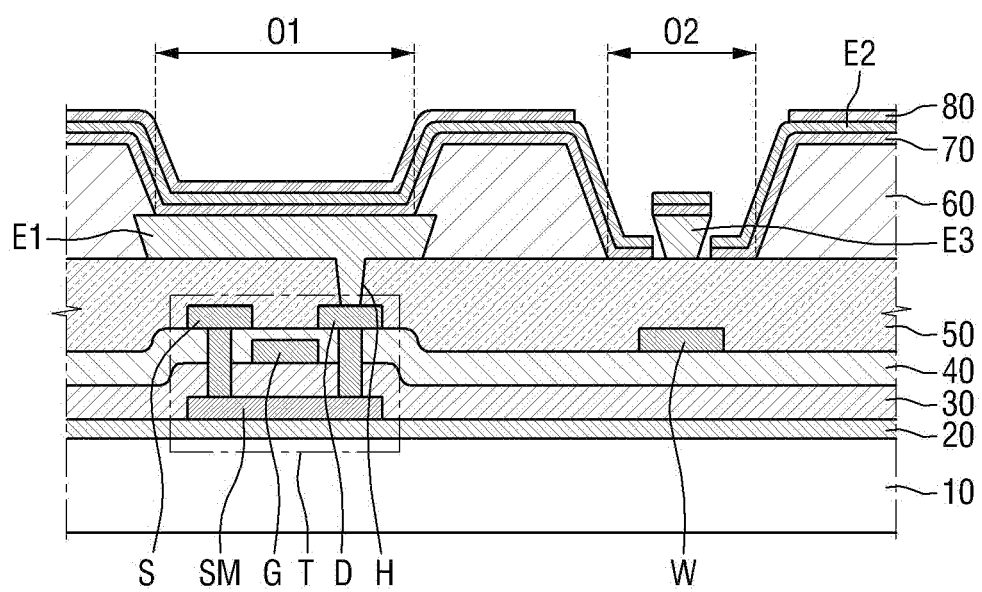

Referring to FIG. 9, the method of manufacturing the organic light-emitting display device 1 may include forming a capping layer 80. The capping layer 80 may be formed of an organic material. The capping layer 80 may be formed on the second electrode E2. The capping layer 80 may not be formed in the region adjacent to the auxiliary electrode E3. For example, the capping layer 80 may not be formed in the second aperture O2.

The method of manufacturing the organic light-emitting display device 1 may include forming a metal layer 90. The organic light-emitting display device 1 of FIG. 1 may be completed by the formation of the metal layer 90. The metal layer 90 may be formed in the region adjacent to the auxiliary electrode E3. For example, the metal layer 90 may be formed in the second aperture O2. The capping layer 80 formed of an organic material has low adhesion to a metal. Therefore, even if the metal layer 90 is deposited on the whole surface of the organic light-emitting display device 1 without using a mask, it may not be formed on the capping layer 80 but may be formed only in a region where the capping layer 80 is not formed.

Embodiments of the present invention provide at least one of the following advantages.

The connection of a second electrode to an auxiliary electrode in an organic light-emitting display device can be improved.

In addition, display quality of the organic light-emitting display device can be improved.

However, the effects of the present invention are not restricted to the one set forth herein. The above and other effects of the present invention will become more apparent to one of daily skill in the art to which the present invention pertains by referencing the claims.

What is claimed is:

1. An organic light-emitting display device, comprising:
a substrate;
an insulating layer disposed on the substrate;
a first electrode disposed on the insulating layer;
an organic layer disposed on the first electrode;
a second electrode disposed on the organic layer;
an auxiliary electrode disposed on the insulating layer, the organic layer disposed on the auxiliary electrode; and
a metal layer disposed adjacent to the auxiliary electrode and connected to the auxiliary electrode and the second electrode, the auxiliary electrode and second electrode being electrically connected to each other.

2. The display device of claim 1, wherein the second electrode is optically transparent or semi-transparent.

3. The display device of claim 1, wherein the first electrode reflects light generated by the organic layer.

4. The display device of claim 1, wherein the first electrode and the metal layer are formed of different materials.

5. The display device of claim 1, wherein the metal layer comprises magnesium (Mg).

6. The display device of claim 1, further comprising a capping layer disposed on the second electrode, wherein the capping layer is not disposed in a region adjacent to the auxiliary electrode.

7. The display device of claim 6, wherein the capping layer is formed of an organic material.

8. The display device of claim 6, wherein the metal layer is disposed in a region in which the capping layer is not disposed.

9. The display device of claim 1, further comprising:
a pixel defining layer disposed on the insulating layer; and
a first aperture and a second aperture in which the pixel defining layer is not disposed, wherein the first electrode is disposed in the first aperture, and the auxiliary electrode and the metal layer are disposed in the second aperture.

10. A method of manufacturing an organic light-emitting display device, the method comprising:
forming an insulating layer on a substrate;
forming a first electrode and an auxiliary electrode on the insulating layer, the auxiliary electrode being separated from the first electrode;
forming an organic layer on the first electrode and forming a second electrode on the organic layer;
forming a capping layer on the second electrode; and
forming a metal layer, which is connected to the second electrode and the auxiliary electrode, on the second electrode and the auxiliary electrode, the auxiliary electrode and second electrode being electrically connected to each other, wherein the organic layer disposed on the auxiliary electrode.

11. The method of claim 10, wherein the metal layer is formed without using a mask.

12. The method of claim 10, wherein the capping layer is formed of an organic material, and the metal layer is formed of Mg.

13. The method of claim 10, further comprising forming a pixel defining layer on the insulating layer to form a first aperture which exposes the first electrode and a second aperture which exposes the auxiliary electrode.

14. The method of claim 13, wherein the organic layer and the second electrode are formed after the pixel defining layer is formed.

15. The method of claim 14, wherein the capping layer is not formed in the second aperture.

16. The method of claim 15, wherein the metal layer is formed in the second aperture.

17. The method of claim 10, wherein the second electrode is formed of an optically transparent or semi-transparent material.

18. The method of claim 10, wherein the organic layer and the second electrode are formed on a whole surface of the organic light-emitting display device.

19. The method of claim 10, wherein the capping layer is not formed in a region including the auxiliary electrode.

20. The method of claim 19, wherein the metal layer is formed after the capping layer is formed.

* * * * *